(12) United States Patent
Wang et al.

(10) Patent No.: US 7,457,119 B2
(45) Date of Patent: Nov. 25, 2008

(54) HEATSINK MODULE

(75) Inventors: Feng-Ku Wang, Taipei (TW); Chih-Kai Yang, Taipei (TW); Yu-Chih Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 3 days.

(21) Appl. No.: 11/703,704

(22) Filed: Feb. 8, 2007

(65) Prior Publication Data
US 2008/0192434 A1    Aug. 14, 2008

(51) Int. Cl.
*H05K 7/20* (2006.01)
*F28F 7/00* (2006.01)

(52) U.S. Cl. .................. 361/700; 165/104.33; 165/121; 361/695

(58) Field of Classification Search .................. 361/700
See application file for complete search history.

(56) References Cited

U.S. PATENT DOCUMENTS

| | | | | |
|---|---|---|---|---|
| 5,835,347 A | * | 11/1998 | Chu | ............................ 361/697 |
| 5,940,267 A | * | 8/1999 | Katsui et al. | ................ 361/697 |
| 6,137,680 A | * | 10/2000 | Kodaira et al. | .............. 361/697 |
| 6,375,418 B1 | * | 4/2002 | Watanabe et al. | ........... 415/178 |
| 6,434,005 B1 | * | 8/2002 | Vinciarelli et al. | ........... 361/704 |
| 6,549,406 B1 | * | 4/2003 | Olesiewicz et al. | ......... 361/695 |
| 7,174,952 B1 | * | 2/2007 | Hong et al. | .................. 165/122 |
| 7,339,787 B2 | * | 3/2008 | Cheng et al. | ................. 361/695 |
| 2008/0023176 A1 | * | 1/2008 | Peng et al. | .................. 165/80.3 |

* cited by examiner

Primary Examiner—Gregory D Thompson
(74) Attorney, Agent, or Firm—Rabin & Berdo, P.C.

(57) ABSTRACT

A heatsink module used for dissipating heat generated by a heat generating component is provided. The heatsink module includes a heat pipe, a heatsink fin assembly, a fan blade motor set, a fan shell, and an external cover. The heat pipe conducts the heat generated by the heat generating component to the heatsink fin assembly. The fan blade motor set, disposed in the fan shell and covered by the external cover, operates to generate an airflow passing through the heatsink fin assembly to dissipate the heat on the heatsink fin assembly. The fan shell has a plurality of buckling components, and the external cover has a plurality of matching components disposed at the edge corresponding to the buckling components, such that the buckling components and the matching components are buckled together when the external cover is covered on the fan shell, so as to fast combine the parts.

9 Claims, 8 Drawing Sheets

HEATSINK MODULE

BACKGROUND OF THE INVENTION

1. Field of Invention

The present invention relates to a heatsink module structure, and more particularly to a heatsink module that can fast combine an external cover onto a fan shell.

2. Related Art

At present, most of the heatsink modules applicable to notebook computers employ the combination of a heat conducting pipe, a heatsink, together with a fan to perform heat dissipation. That is, the fan is used to drive air to flow to exchange heat with fins of the heatsink used for heat collection, so as to bring away the heat of the fins to reduce the temperature.

Thus, referring to FIG. 1, a schematic combined diagram of a heatsink module according to a prior art is shown. In FIG. 1, the structure of a heatsink module 100 is described as follows: a fan blade set 150 is disposed in a shell 130 of a fan 110; a heatsink fin assembly 170 is connected to a side surface of the shell 130; one end of a heat pipe 210 is fixed to one side surface of an upper cover 190, while the other end of the heat pipe 210 is fixed to the other side surface of the upper cover 190 and contacts the heatsink fin assembly 170; a plurality of bolts 230 passes through the upper cover 190 to lock the upper cover 190 in the shell 130. As the upper cover 190 is locked in the shell 130 via the bolts 230, it takes too much time to assemble the upper cover 190 into the shell 130, thus making the overall capacity unable to be improved.

SUMMARY OF THE INVENTION

In view of the above problem, the present invention is directed to providing a heatsink module, so as to dissipate the heat generated by a heat generating component, and accelerate the assembling speed of the heatsink module.

Therefore, the present invention discloses a heatsink module, which comprises a heat pipe, a heatsink fin assembly, a fan blade motor set, a fan shell, and an external cover. One end of the heat pipe is connected to the heat generating component to conduct the heat generated by the heat generating component to the other end of the heat pipe. The heatsink fin assembly is connected to the other end of the heat pipe opposite to the heat generating component, so as to conduct the heat of the heat pipe to the heatsink fin assembly. One side of the fan blade motor set is connected to the heatsink fin assembly, and the airflow generated by the fan blade motor set passes through the heatsink fin assembly to dissipate the heat of the heatsink fin assembly. The fan shell accommodates the heatsink fin assembly and the fan blade motor set, and a plurality of buckling holes is disposed at the side edge of the fan shell. The external cover is covered on the fan shell, and has a plurality of buckles corresponding to the buckling holes, wherein when the external cover is covered onto the fan shell, the buckles are buckled into the buckling holes.

The plurality of buckles has a plurality of plates disposed at the edge of the external cover. Each plate is corresponding to each buckling hole, and a bump is formed on the side of each plate corresponding to each buckling hole. Each bump can be embedded into the corresponding buckling hole, such that the external cover is fast buckled to the fan shell, and a cover clamp is formed by extending the external cover to overlay the heat pipe, so as to press against the heat pipe.

A fastening plate is extended outward from around each buckling hole and is corresponding to the buckling hole. An auxiliary buckling hole is disposed in the fastening plate corresponding to each buckling hole. Each plate has an auxiliary bump corresponding to the auxiliary buckling hole, and the auxiliary bump can be embedded into the auxiliary buckling hole.

In view of the above, the fan shell and external cover of the present invention are integrally formed, such that structures such as buckling holes or fastening plates can be directly formed on the fan shell, and the cover clamp, plates, bumps, and auxiliary bumps can also be directly formed on the external cover. Therefore, as for the processing of the fan shell and external cover, only a small amount of extra manufacturing cost is needed, and the speed of assembling the external cover onto the fan shell can be greatly accelerated. Compared with the prior art, the manner of locking or riveting by screws in a conventional fan cannot fast combine the external cover and the fan shell.

The features and practice of the preferred embodiments of the present invention will be illustrated in detail below with the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1:
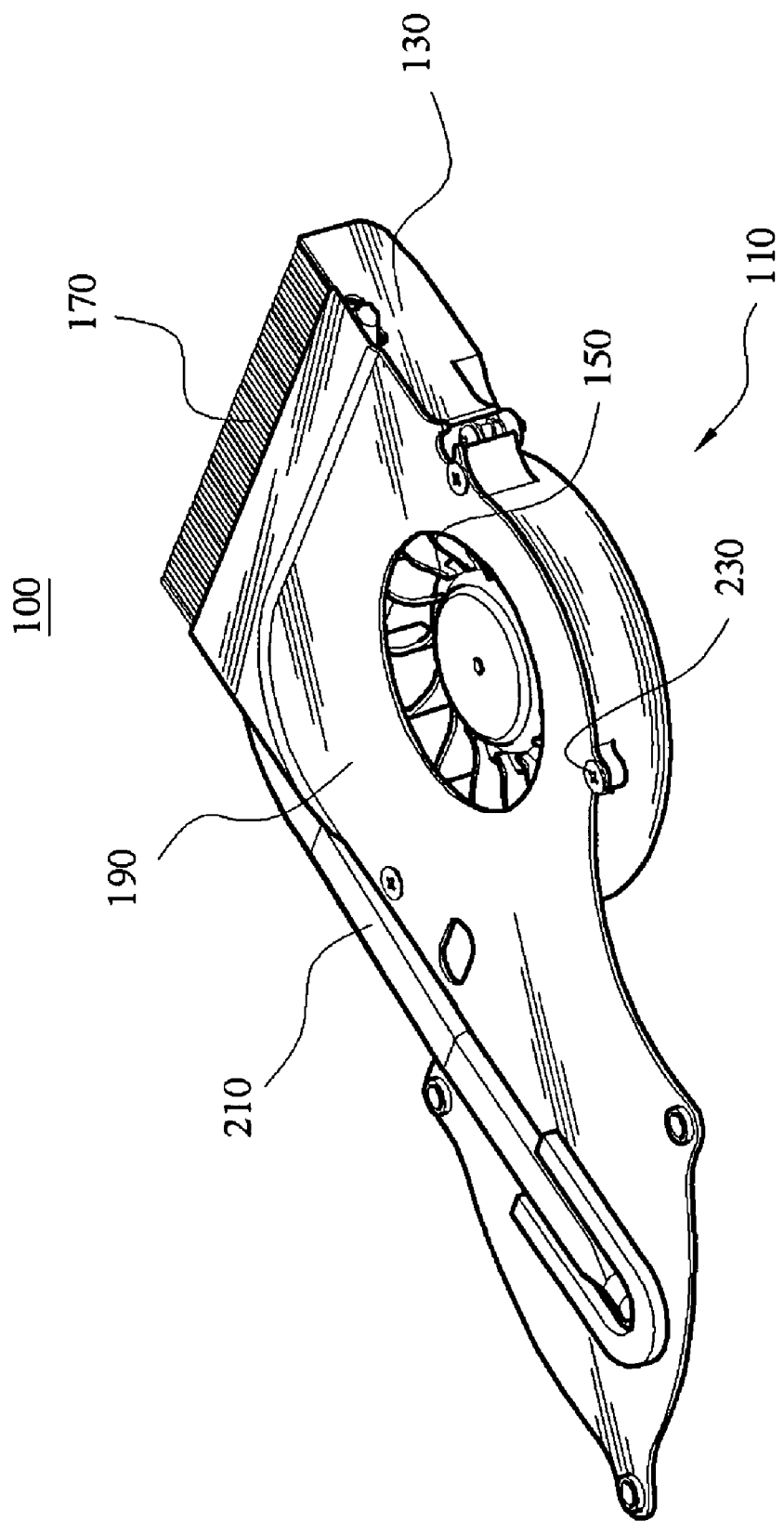
FIG. 1 is a schematic combined diagram of a heatsink module according to the prior art.
Figure 2:
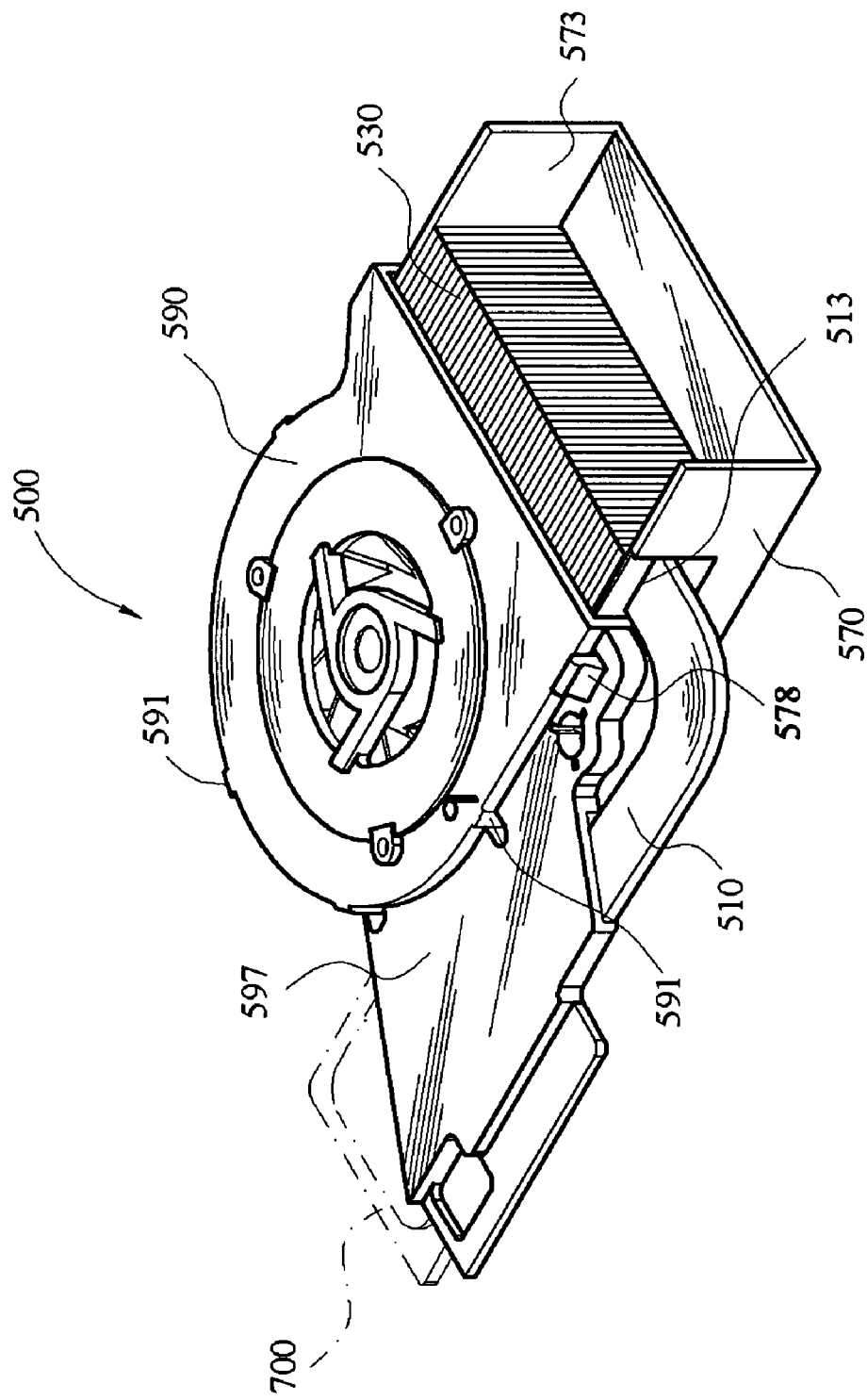
FIG. 2 is a schematic combined diagram of a first embodiment of the present invention.
Figure 3:
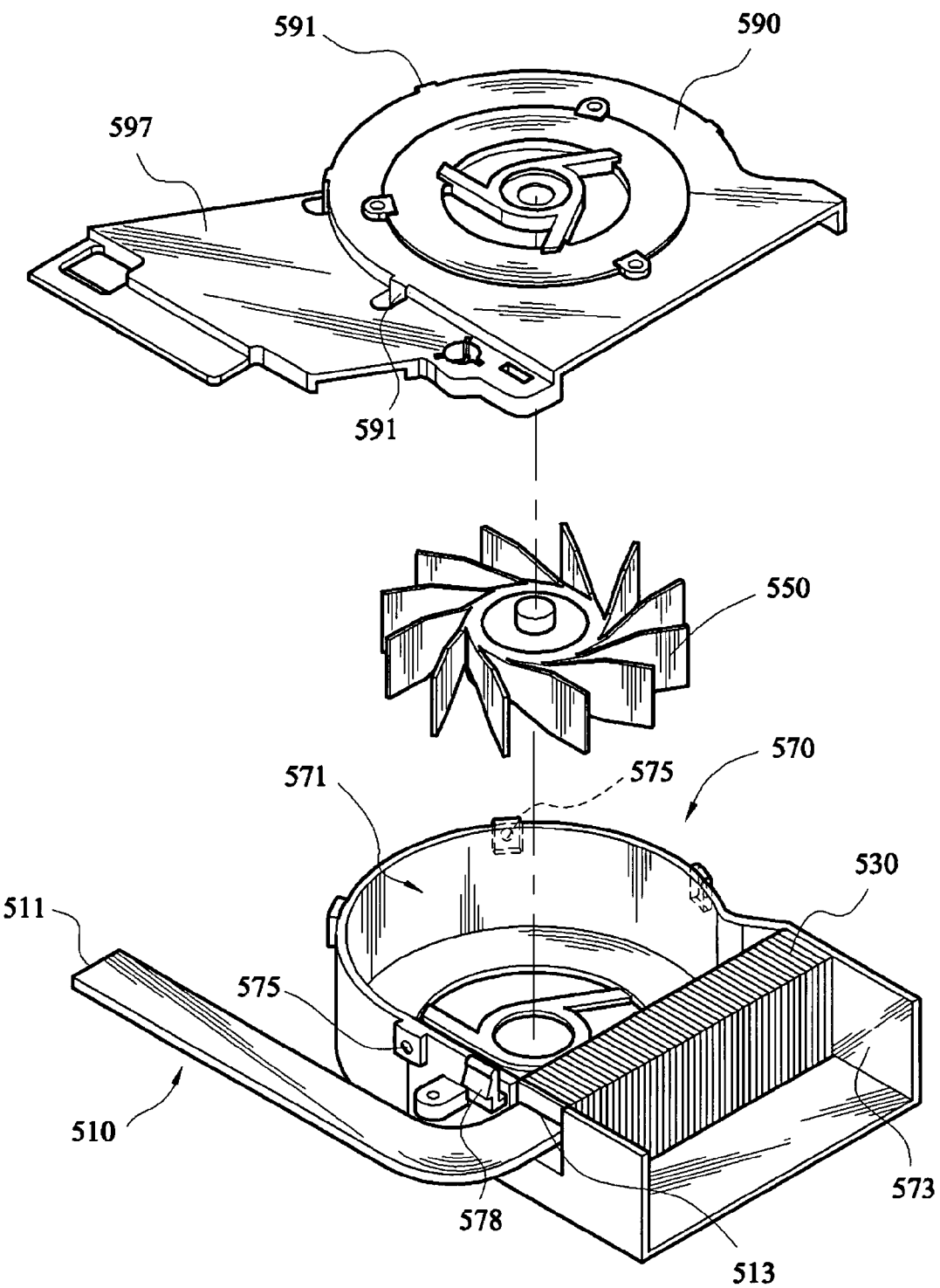
FIG. 3 is a schematic exploded view of the first embodiment of the present invention.
Figure 4:
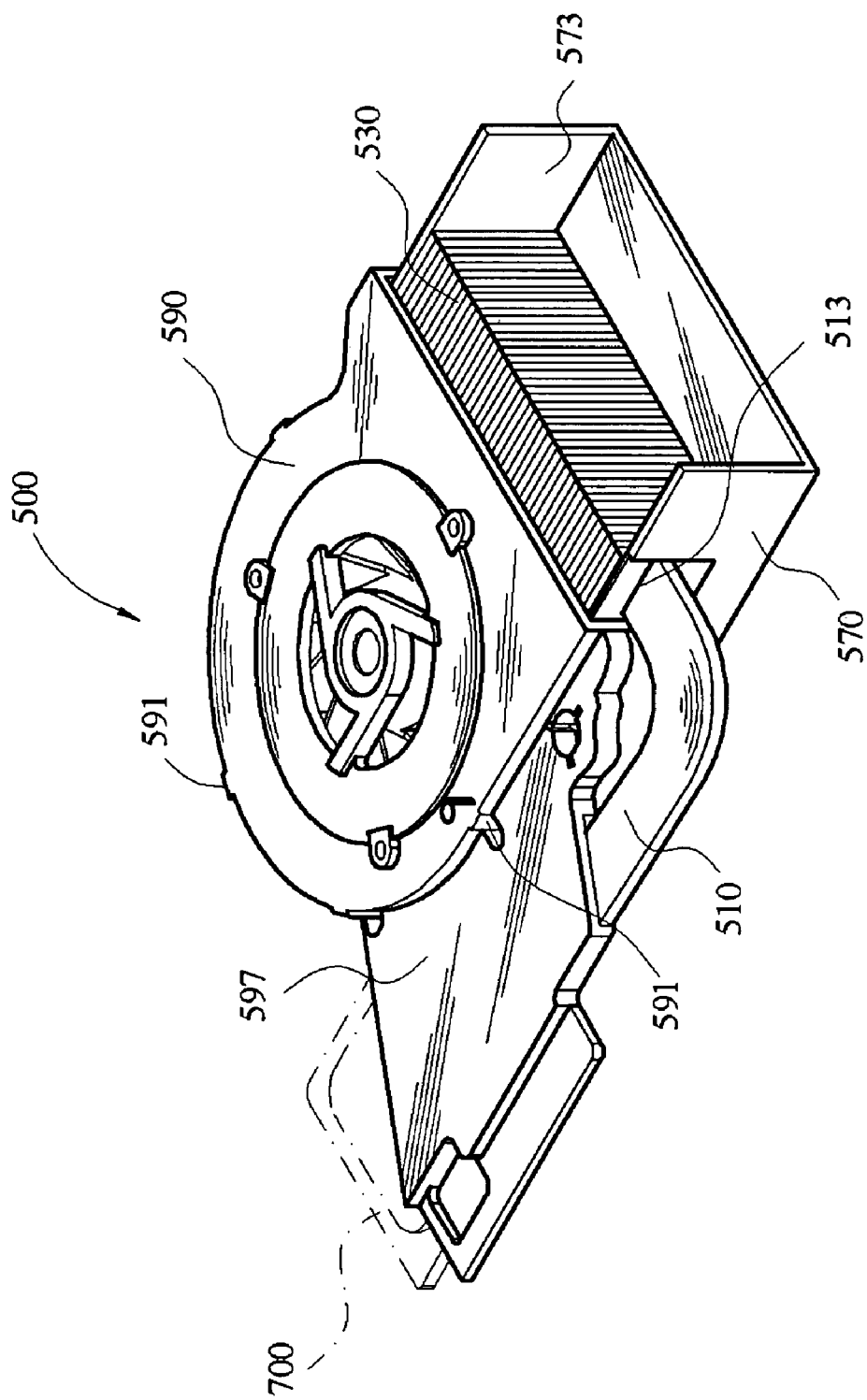
FIG. 4 is a schematic combined diagram of a second embodiment of the present invention.
Figure 5:
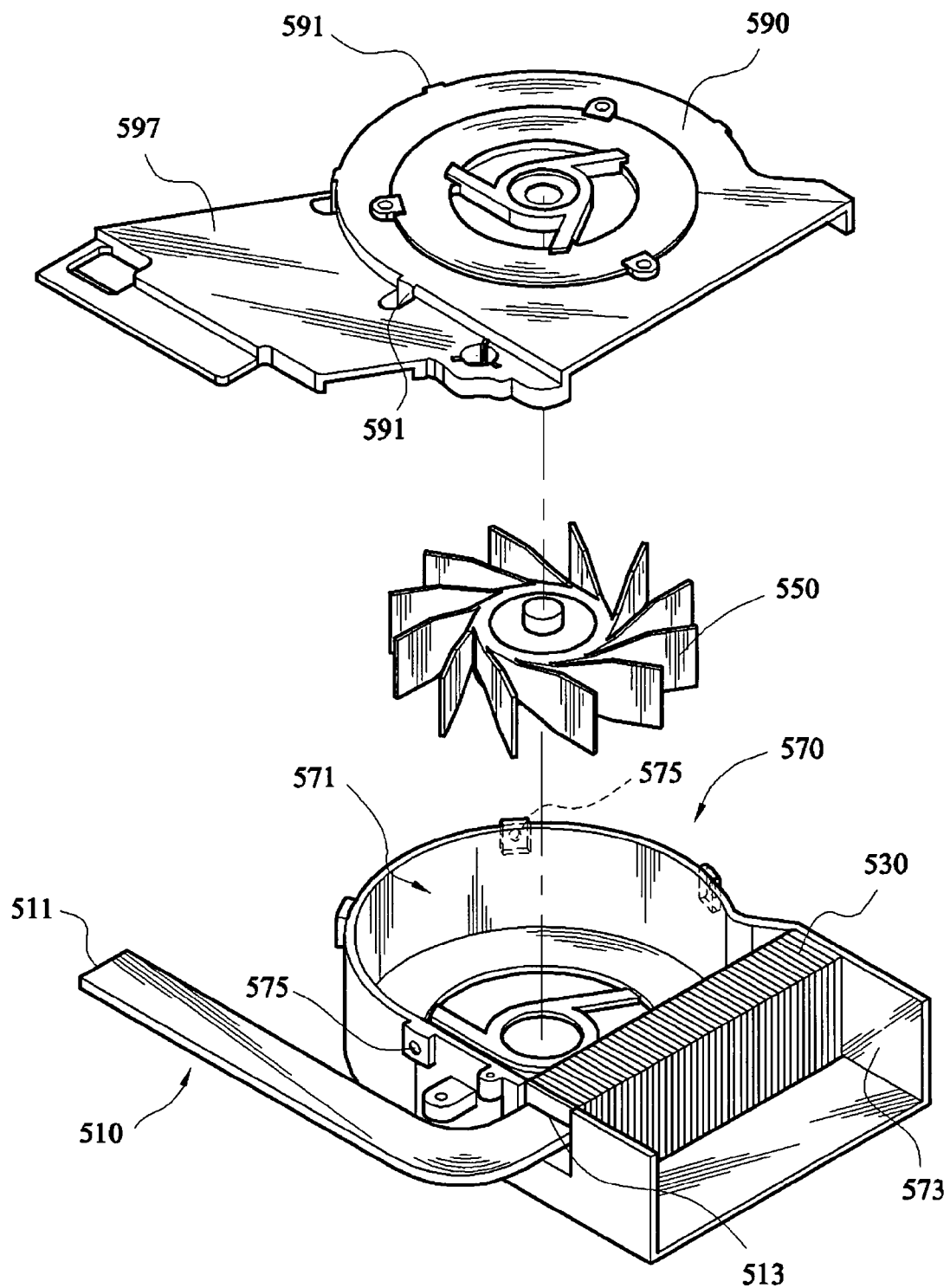
FIG. 5 is a schematic exploded view of the second embodiment of the present invention.
Figure 6B:
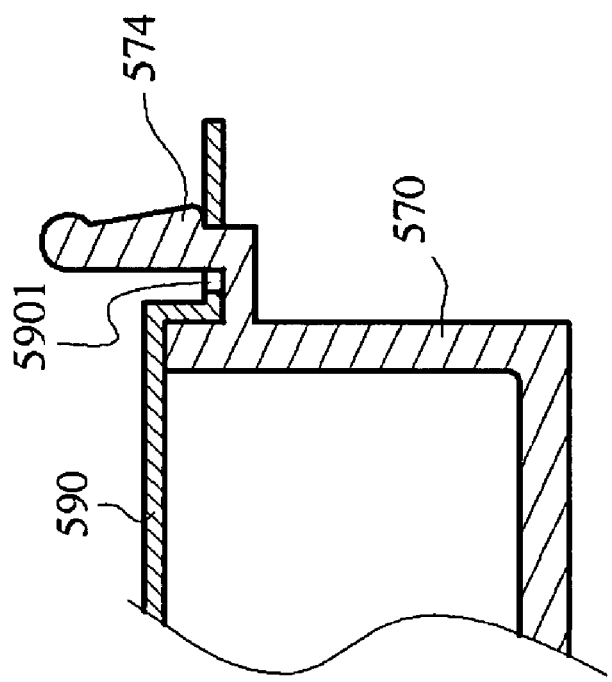
FIGS. 6A and 6B are schematic views of a buckling component embedded in a matching component according to the first embodiment of the present invention.
Figure 6A:
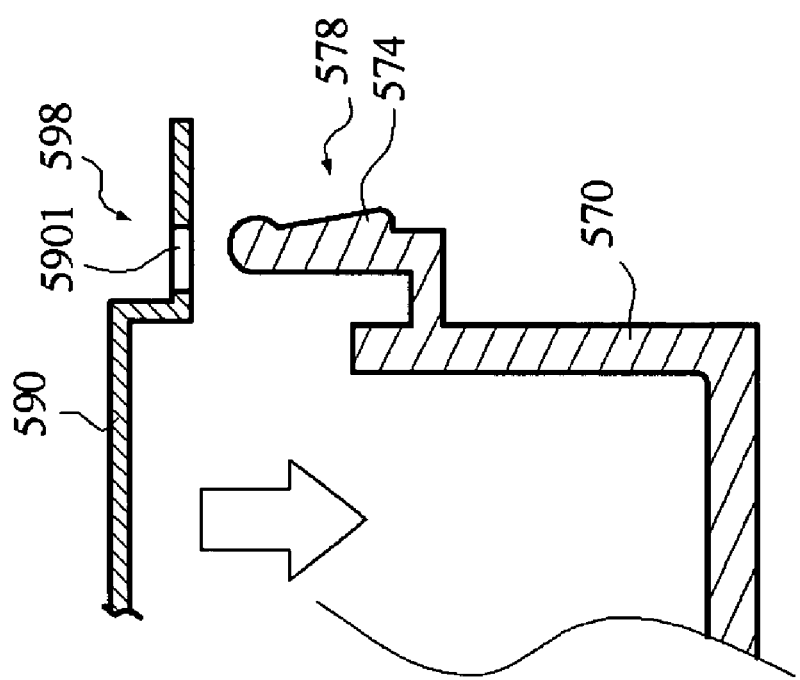
Figure 7B:
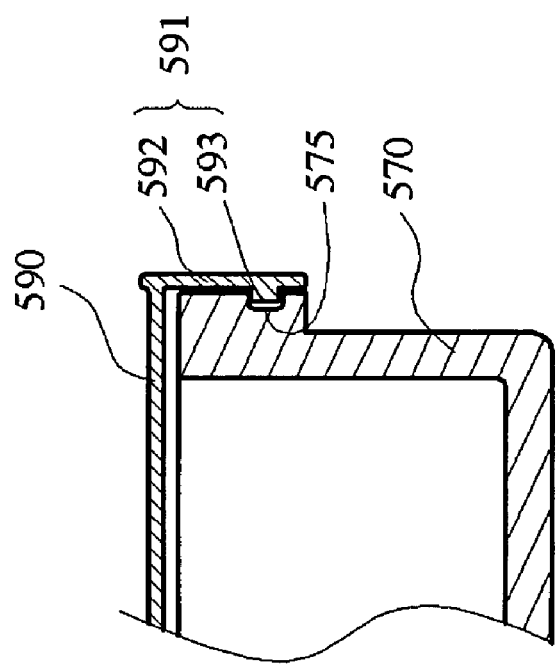
FIGS. 7A and 7B are schematic views of a buckling component embedded in a matching component according to the second embodiment of the present invention.
Figure 7A:
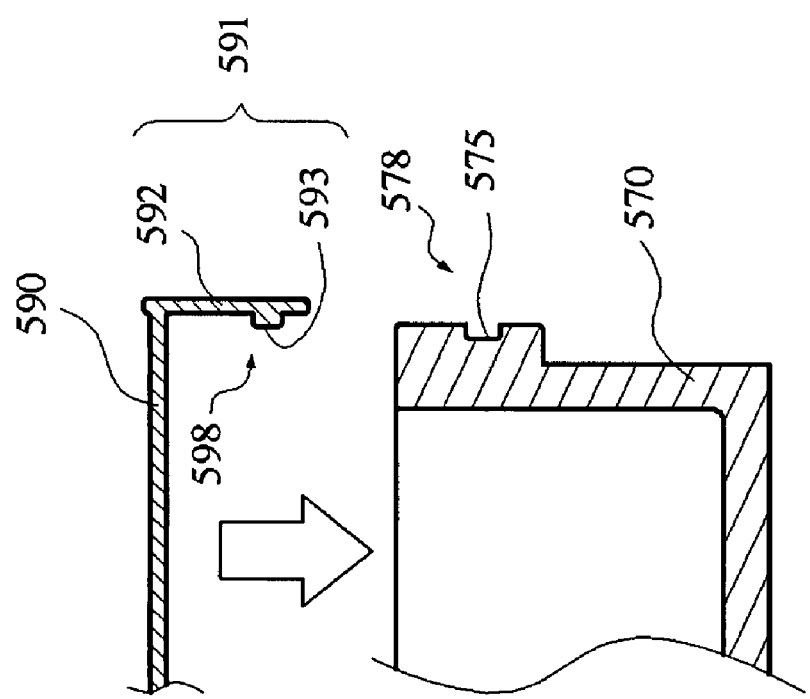

Referring to FIGS. 2, 3, 6A, and 6B, a combined view, an exploded view of a first embodiment of the present invention and schematic views of a buckling component embedded into a matching component according to the first embodiment of the present invention are shown. In FIGS. 2, 3, 6A, and 6B, the present invention provides a heatsink module 500 for dissipating the heat generated by a heat generating component 700. The heatsink module 500 includes a heat pipe 510, a heatsink fin assembly 530, a fan blade motor set 550, a fan shell 570, and an external cover 590. The heat pipe 510 is of an L-shaped configuration and includes a first end 511 and a second end 513. The first end 511 is connected to the heat generating component 700 to conduct the heat generated by the heat generating component 700 to the second end 513 of the heat pipe 510. The heatsink fin assembly 530 is connected to the second end 513 of the heat pipe 510, such that the heat of the heat pipe 510 is again conducted to the heatsink fin assembly 530. Therefore, the material of the heatsink fin assembly 530 is highly thermal conductive metal, such as Al or Cu. The fan blade motor set 550 is disposed beside the heatsink fin assembly 530, such that the airflow generated by the operation of the fan blade motor set 550 passes through the heatsink fin assembly 530 to dissipate the heat of the heatsink fin assembly 530.

The fan shell 570 has an accommodation space 571 and is generally in a U-shaped configuration. An air outlet 573 is disposed on one side of the fan shell 570, the fan blade motor set 550 is disposed in the accommodation space 571, and the heatsink fin assembly 530 is fixed to the air outlet 573, such that when the airflow generated by the operation of the fan blade motor set 550 is blown out of the air outlet 573, the heat of the heatsink fin assembly 530 is dissipated to the outside. A plurality of buckling components 578 is disposed at the side edge of the fan shell 570, and the buckling components 578 are inverted hooks 574 in the first embodiment. The external cover 590 has a plurality of matching components 598 corresponding to the buckling components 578, and in this embodiment, the matching components 598 are hook holes 5901. Each buckling component 578 is corresponding to a matching component 598, and the two parts are caught with each other, such that the external cover 590 can be fast buckled to the fan shell 570. A cover clamp 597 is formed by extending the external cover 590 to overlay the heat pipe 510 to press against the heat pipe 510.

Referring to FIGS. 4, 5, 7A, and 7B at the same time, a combined view, an exploded view of a second embodiment of the present invention, and schematic views of a buckling component embedded into a matching component according to the second embodiment of the present invention are shown. In the figures, the main structure of the second embodiment is identical to that of the first embodiment, which includes parts such as the fan shell 570 and the fan blade motor set 550, and the difference is that the buckling components 578 disposed at the side edge of the fan shell 570 are implemented as a plurality of buckling holes 575. The matching components 598 of the external cover 590 are implemented as a plurality of buckles 591 each of which has a plate 592 disposed at the edge thereof. Each plate 592 is corresponding to each buckling hole 575, and a bump 593 is formed on each plate 592 corresponding to each buckling hole 575. When the external cover 590 is covered onto the fan shell 570, the bumps 593 are embedded into the buckling holes 575, such that the external cover 590 can be fast buckled to the fan shell 570. A cover clamp 597 is formed by extending the external cover 590 to overlay the heat pipe 510, so as to press against the heat pipe 510.

Figures 8A, 8B, 8C:
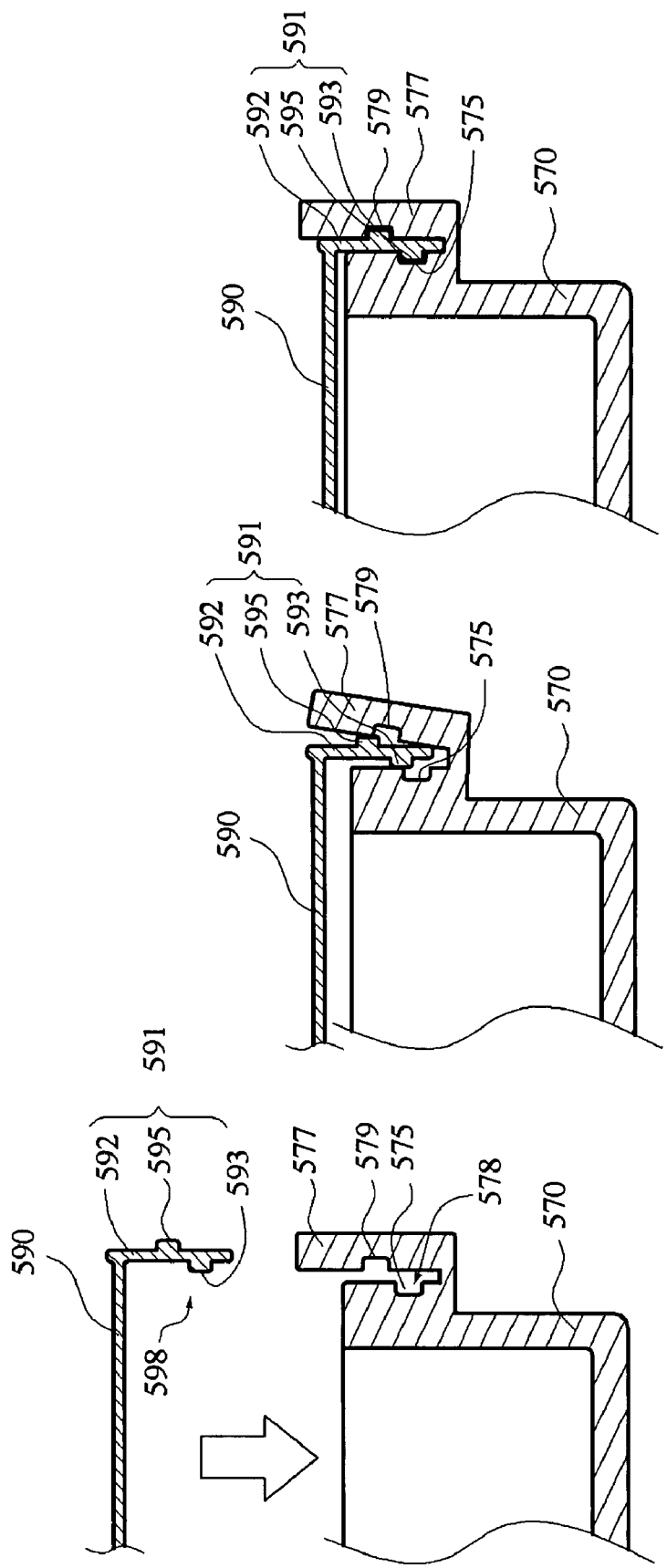
FIGS. 8A, 8B, and 8C are schematic views of a buckling component embedded in a matching component according to a third embodiment of the present invention.

Referring to FIGS. 8A, 8B, and 8C, schematic views of a buckling component embedded into a matching component according to a third embodiment of the present invention are shown. As seen in FIGS. 8A, 8B, and 8C, the buckling components 578 and the matching components 598 are implemented as the buckling holes 575 and buckles 591. A fastening plate 577 is extended outward from around each buckling hole 575 and is corresponding to the buckling hole 575. An auxiliary buckling hole 579 is disposed in each fastening plate 577 corresponding to the buckling hole 575. Each plate 592 has an auxiliary bump 595 corresponding to the auxiliary buckling hole 579. When the external cover 590 is covered onto the fan shell 570, the bumps 593 of the plates 592 are embedded into the buckling holes 575 of the fan shell 570, and the auxiliary bumps 595 of the plates 592 are embedded into the auxiliary buckling holes 579 of the fastening plates 577, thus enhancing the retaining strength of the external cover 590 covered onto the fan shell 570.

The fan shell and the external cover of the present invention can be integrally formed, such that structures such as buckling holes or fastening plates can be directly formed on the fan shell, and the cover clamp, plates, bumps, and auxiliary bumps can also be directly formed on the external cover to constitute buckles. Therefore, as for the processing of the fan shell and external cover, only a small amount of extra manufacturing cost is needed, and the speed of assembling the external cover onto the fan shell can be greatly accelerated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heatsink module, used for dissipating heat generated by a heat generating component, the heatsink module comprising:
   a heat pipe having a first end connected to the heat generating component, for conducting the heat of the heat generating component to a second end of the heat pipe;
   a heatsink fin assembly, connected to the second end of the heat pipe, which is opposite to the heat generating component, for conducting the heat of the heat pipe away therefrom;
   a fan blade motor set, for generating an airflow passing through the heatsink fin assembly to dissipate the heat from the heatsink fin assembly;
   a fan shell, accommodating the heatsink fin assembly and the fan blade motor set, and having a plurality of buckling components, each buckling component including:
      a buckling hole disposed at a side edge of said fan shell;
      a fastening plate extending outward and having an inside surface facing a respective buckling hole; and
      an auxiliary buckling hole disposed in the inside surface of a respective fastening plate; and
   an external cover, covering the fan shell, and having a plurality of buckles, each buckle having a plate corresponding to, and being receivable within, a respective one of the buckling components, wherein each plate extends downward from a rim of the external cover and has a bump and an auxiliary bump, the bump being formed on a side of the plate corresponding to the buckling hole, the auxiliary bump being formed on another side of the plate corresponding to the auxiliary buckling hole, the bump being receivable in the buckling hole, and the auxiliary bump being receivable in the auxiliary buckling hole, whereby the external cover is buckled to the fan shell.

2. The heatsink module as claimed in claim 1, wherein a cover clamp is formed by extending the external cover to overlay the heat pipe, so as to press against the heat pipe.

3. The heatsink module as claimed in claim 2, wherein the cover clamp is integrally formed.

4. The heatsink module as claimed in claim 1, wherein the fan shell is integrally formed.

5. The heatsink module as claimed in claim 1, wherein the external cover is integrally formed.

6. The heatsink module as claimed in claim 1, wherein the material of the heatsink fin assembly is Cu.

7. The heatsink module as claimed in claim 1, wherein the heat pipe is L-shaped.

8. The heatsink module as claimed in claim 1, wherein the fan shell is U-shaped.

9. A heatsink module, used for dissipating heat generated by a heat generating component, the heatsink module comprising:
- a heat pipe, having an L-shape, with a first end being connected to the heat generating component, for conducting the heat of the heat generating component to a second end of the heat pipe;
- a heatsink fin assembly, connected to the second end of the heat pipe, which is opposite to the heat generating component, for conducting the heat of the heat pipe away therefrom;
- a fan blade motor set, disposed at one side of the heatsink fin assembly, for generating an airflow passing through the heatsink fin assembly to dissipate the heat from the heatsink fin assembly;
- a fan shell, having a U-shape, and having an accommodation space for accommodating the heatsink fin assembly, the fan shell further having an air outlet disposed at a side of the fan blade motor set, and further having:
  - a plurality of buckling holes disposed at a side surface thereof;
  - a plurality of fastening plates, each extending outward from the side surface, and each having an inside surface facing a respective buckling hole; and
  - a plurality of auxiliary buckling holes, each being disposed in the inside surface of a respective fastening plate; and
- an external cover, covering the fan shell, and being extended to overlay the heat pipe, thus forming a cover clamp to press against the heat pipe, the external cover having a plurality of buckles corresponding to the buckling holes, wherein each buckle has a plate disposed at an edge of the external cover; each plate has a bump formed on a side thereof corresponding to a respective buckling hole, each plate further having an auxiliary buckling hole formed on another side thereof corresponding to a respective auxiliary buckling hole, each bump being receivable within a corresponding buckling hole, and each auxiliary bump being receivable within a corresponding auxiliary buckling hole, whereby the external cover is buckled to the fan shell.

* * * * *